United States Patent
Chen

(10) Patent No.: US 10,719,272 B2
(45) Date of Patent: Jul. 21, 2020

(54) DATA STORAGE DEVICE AND CONTROL METHOD FOR NON-VOLATILE MEMORY

(71) Applicant: Silicon Motion, Inc., Jhubei, Hsinchu County (TW)

(72) Inventor: Liang-Cheng Chen, Changhua County (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 21 days.

(21) Appl. No.: 16/255,925

(22) Filed: Jan. 24, 2019

(65) Prior Publication Data
US 2020/0034080 A1    Jan. 30, 2020

(30) Foreign Application Priority Data

Jul. 26, 2018   (TW) .............................. 107125923 A

(51) Int. Cl.
*G06F 11/30*    (2006.01)
*G06F 3/06*    (2006.01)
*G11C 29/44*    (2006.01)

(52) U.S. Cl.
CPC .......... *G06F 3/0659* (2013.01); *G06F 3/0604* (2013.01); *G06F 3/0679* (2013.01); *G11C 29/44* (2013.01)

(58) Field of Classification Search
None
See application file for complete search history.

(56) References Cited

U.S. PATENT DOCUMENTS

| 7,965,554 B2 | 6/2011 | Lutze et al. | |
| 2013/0311840 A1* | 11/2013 | Miyata | H04L 1/203 |
| | | | 714/704 |
| 2015/0286528 A1* | 10/2015 | Cai | G06F 11/1004 |
| | | | 714/763 |
| 2015/0296224 A1* | 10/2015 | Davis | H04N 19/154 |
| | | | 375/240.26 |
| 2017/0154656 A1 | 6/2017 | Yeh | |
| 2019/0121696 A1* | 4/2019 | Chen | G06F 12/0246 |

FOREIGN PATENT DOCUMENTS

| TW | 200822119 A | 5/2008 |
| TW | 201015558 A | 4/2010 |
| TW | 201719671 A | 6/2017 |
| TW | 201719673 A | 6/2017 |
| WO | 2008/042605 A1 | 4/2008 |

* cited by examiner

*Primary Examiner* — Mujtaba M Chaudry
(74) *Attorney, Agent, or Firm* — McClure, Qualey & Rodack, LLP

(57) ABSTRACT

Multi-channel accessing of non-volatile memory. A controller uses three kinds of tables to manage cross-channel accessing areas and, accordingly, to access the non-volatile memory through multiple channels. Each cross-channel accessing area includes M storage units, where M is an integer greater than 1. For each cross-channel accessing area, the first table marks whether there is a need for storage unit substitution and points to substitution information. The substitution information is stored in the second table and the third table. For each cross-channel accessing area marked in the first table, the second table stores M bits corresponding to M storage units of the marked cross-channel accessing area for substitution indication, and related substitute storage unit indication is stored in the third table.

20 Claims, 8 Drawing Sheets

DATA STORAGE DEVICE AND CONTROL METHOD FOR NON-VOLATILE MEMORY

CROSS REFERENCE TO RELATED APPLICATIONS

This Application claims priority of Taiwan Patent Application No. 107125923, filed on Jul. 26, 2018, the entirety of which is incorporated by reference herein.

BACKGROUND OF THE INVENTION

Field of the Invention

The present invention relates to data storage devices and control methods for non-volatile memory of data storage device.

Description of the Related Art

There are various forms of non-volatile memory (NVM) for long-term data retention, such as flash memory, magnetoresistive RAM, ferroelectric RAM, resistive RAM, spin transfer torque-RAM (STT-RAM), and so on.

A non-volatile memory may be accessed through multiple channels and thereby data is read and written in parallel through the multiple channels and the operational efficiency of the non-volatile memory is enhanced. In order to avoid using damaged storage units, the cross-channel accessing areas do not always have storage units aligned among the different channels. A mapping table for managing cross-channel accessing areas, therefore, is necessary. As non-volatile memories become larger and larger in size, the increasing size of the mapping table may become a burden.

BRIEF SUMMARY OF THE INVENTION

A simplified management technology for cross-channel accessing areas of non-volatile memory is disclosed.

A data storage device in accordance with an exemplary embodiment of the disclosure comprises a non-volatile memory and a controller. The controller accesses the non-volatile memory through multiple channels. The controller uses a first table, a second table and a third table to manage cross-channel accessing areas on the non-volatile memory and accesses the non-volatile memory through multiple channels based on the first table, the second table and the third table. Each cross-channel accessing area involves M storage units, where M is a plural number. For each cross-channel accessing area, the first table marks whether there is a need for storage unit substitution and points to substitution information. The substitution information is stored in the second table and the third table. For each cross-channel accessing area marked in the first table, the second table stores M bits corresponding to M storage units of the marked cross-channel accessing area for substitution indication, and related substitute storage unit indication is stored in the third table.

In an exemplary embodiment, the third table is maintained without storing information for storage units which have no need for substitution.

Each entry of the third table may be a preset length. Each entry of the second table may store the M bits in the preset length and may be followed by the related substitute storage unit indication which is used to form the third table. The first table points to the second table by an offset number calculated according to the preset length.

During a card-opening process, the controller may establish the first table, the second table and the third table based on a damaged storage unit table recorded in the non-volatile memory, and avoid allocating damaged storage units to form the cross-channel accessing areas.

The damaged storage unit table may be established during a manufacturing process. A manufacturing machine may scan the non-volatile memory to establish the damaged storage unit table.

In some exemplary embodiments, a control method for non-volatile memory is shown, which includes: establishing a first table, a second table and a third table to manage cross-channel accessing areas on a non-volatile memory; and accessing the non-volatile memory through multiple channels based on the first table, the second table and the third table. Each cross-channel accessing area involves M storage units, where M is a plural number. For each cross-channel accessing area, the first table marks whether there is a need for storage unit substitution and points to substitution information. The substitution information is stored in the second table and the third table. For each cross-channel accessing area marked in the first table, the second table stores M bits corresponding to M storage units of the marked cross-channel accessing area for substitution indication, and related substitute storage unit indication is stored in the third table.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

A non-volatile memory for long-term data retention may be a flash memory, a magnetoresistive RAM, a ferroelectric RAM, a resistive RAM, a spin transfer torque-RAM (STT-RAM) and so on. A non-volatile memory may be used to implement a data storage device or a data center. The following discussion uses flash memory as an example.

Flash memory is often used as a storage medium in today's data storage devices. Flash memory is often implemented in memory cards, USB flash devices, SSDs, and so on. In another exemplary embodiment, a flash memory may be packaged with a controller to form a multiple-chip package named eMMC.

A data storage device using a flash memory as a storage medium can be applied in a variety of electronic devices, including a smartphone, a wearable device, a tablet computer, a virtual reality device, etc. A calculation module of an electronic device may be regarded as a host that operates a data storage device equipped on the electronic device to access a flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

The storage space of flash memory is discussed in this paragraph. A flash memory includes a plurality of planes (e.g., including 2 planes). Each plane includes a plurality of blocks (e.g., including 2048 blocks). Each block includes a plurality of pages (e.g., including 1024 pages). To improve operational efficiency, a flash memory controller may access the flash memory through multiple channels. Each channel may provide multiple ways. Each way may involve accessing of just one single plane or accessing of multiple planes. The flash memory controller preferably accesses multiple planes in an interleaving way. The different planes each may provide one block to form a cross-channel accessing area to achieve multi-channel accessing. Data, therefore, are accessed in parallel through the multiple channels.

Figure 1:
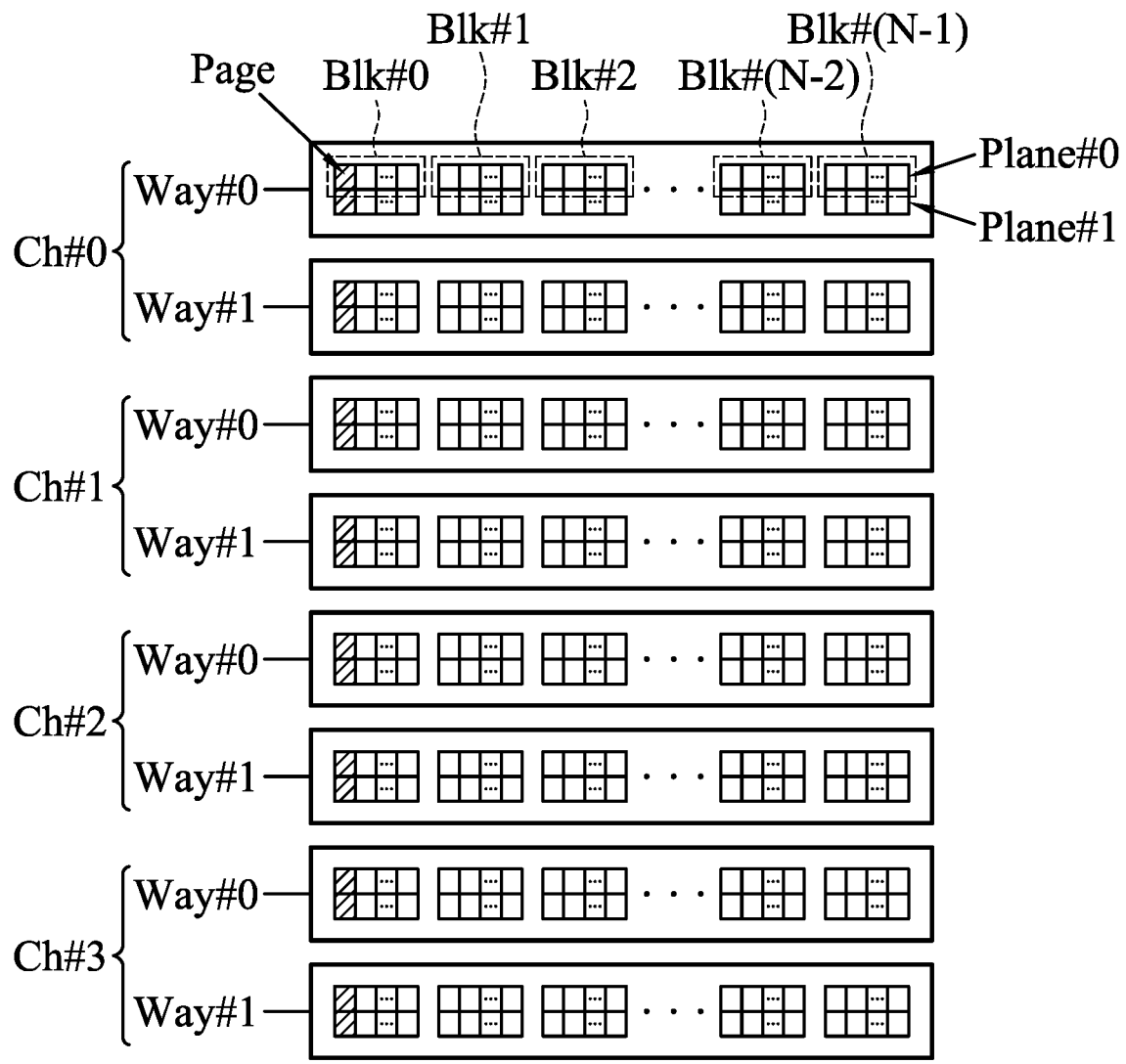
FIG. 1 illustrates a flash memory storage space which is accessed through four channels Ch #0 . . . Ch #3.

FIG. 1 illustrates a flash memory storage space which is accessed through four channels Ch #0 . . . Ch #3. Each channel provides two ways Way #0 and Way #1. Each way is provided to access two planes Plane #0 and Plane #1. As shown, one plane has N (e.g., N=1024) blocks Blk #0, Blk #1, Blk #2 . . . , and Blk #(N−1). In each block (e.g. Blk #0), the programming unit may be one page. The total number of channels is 4, the total number of ways per channel is 2, and the total number of planes per way is 2. As shown, there are 16 planes (4*2*2 planes). When each plane provides one block, a super block FBlock is established and used as a cross-channel accessing area.

Each super block FBlock includes 16 blocks provided by the 16 different planes. The 16 blocks are member blocks of the super block FBlock. The member blocks preferably have the same block number. To control the programming sequence of the pages of the different member blocks, the different member blocks are allocated to provide super pages. Each super page is formed by 16 member pages provided by the 16 member blocks. As marked by the oblique lines, one super page is defined. The 16 member pages preferably have the same page number. The flash memory controller preferably programs the super pages within one super block according to the order of the page number.

It should be noted that the bad (damaged) blocks within a flash memory should not be used in allocating super blocks FBlocks. For example, if Blk #1 of Plane #0 accessed through Way #0 of Ch #0 is a bad block, a substitute block, such as Blk #191, should be selected from the same plane to be combined with the 15 Blk #1 in the other 15 planes to form a super block FBlock #1. In this manner, there is no problem for the flash memory controller to access the super block FBlock #1.

Figure 2:
FIG. 2 illustrates architecture 200 of a remapping table, showing the configuration of the super block FBlock #1 which involves bad block substitution.

FIG. 2 illustrates architecture 200 of a remapping table, showing the configuration of the super block FBlock #1 which involves bad block substitution. The super block FBlock #1 comprises 16 blocks located in 16 different planes. To replace the bad block Blk #1 of Plane #0 accessed through Way #0 of Ch #0, block Blk #(N−1), such as Blk #191, in the same plan is adopted to form the super block FBlock #1 with blocks Blk #1 provided in the other 15 planes. Taking such a four-channel, dual-way and dual-plane architecture as an example, the whole remapping table in the architecture of 200 may be 32 bytes. As for a four-channel, eight-way and four-plane, the whole remapping table in the architecture of 200 may be 256 bytes. With the increasing size of flash memory, there is a large amount of super blocks FBlocks and a large space is required to record the allocation of the super blocks FBlocks. When being downloaded to a random access memory (e.g. DRAM or SRAM) by the flash memory controller, the remapping table also occupies too much RAM space. This problem is more serious in a data storage device configured with only a small-sized RAM. An improved structure for remapping tables, therefore, is called for.

Figure 3:
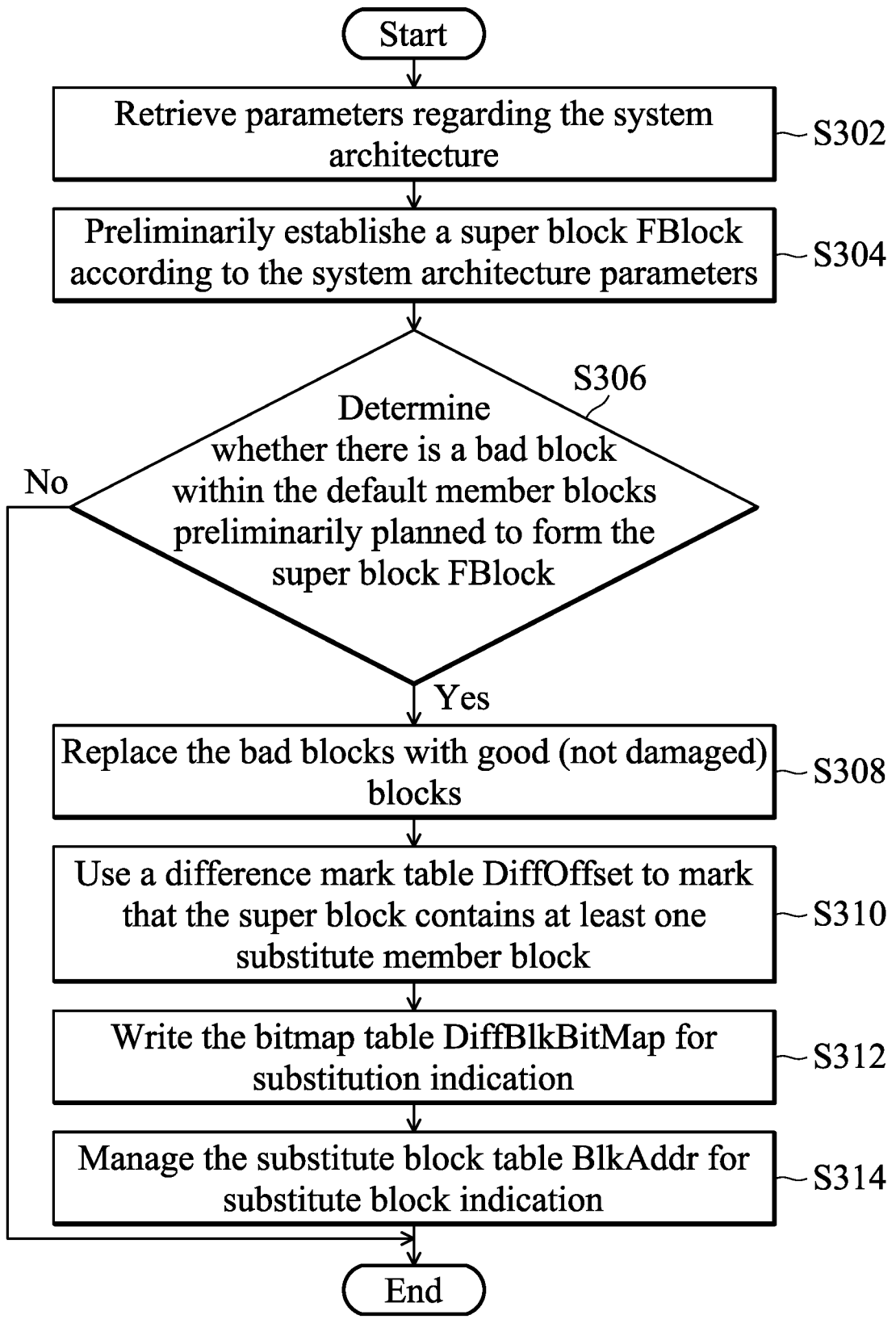
FIG. 3 is a flow chart depicting a method for allocating a super block FBlock in accordance with an exemplary embodiment of the disclosure.

FIG. 3 is a flow chart depicting a method for allocating a super block FBlock in accordance with an exemplary embodiment of the disclosure. After system initialization, step S302 is performed. The flash memory controller retrieves parameters regarding the system architecture, which indicate the number of channels, the number of ways, and the number of planes and are used in establishing the super block FBlock. In an exemplary embodiment, the parameters show that the flash memory is accessed through two channels, and each channel provides two ways each involving access of two planes.

In step S304, the flash memory controller preliminarily establishes a super block FBlock according to the system architecture parameters. The flash memory controller allocates the planes accessed through different ways of different channels each to provide one block as default member blocks of the super block FBlock #1. In an exemplary embodiment, there are 8 planes and 8 blocks form one super block. The default member blocks preferably have the same block number. For example, referring to FIG. 2, Blk #1 of all planes are regarded as default member blocks of super block FBlock #1.

In step S306, the flash memory controller determines whether there is a bad block within the default member blocks preliminarily planned to form the super block FBlock. In an exemplary embodiment, the flash memory controller scans the flash memory for bad blocks before the super page allocation. According to the scanning, the flash memory controller records the block numbers of bad blocks to a bad block table BadBlks. The flash memory controller reads the bad block table BadBlks to determine whether the default member blocks (e.g. Blk #1 in the different planes) preliminarily planned to form a super block (e.g. FBlock #1) include any bad blocks. The bad block table BadBlks may be searched according to the channel number, way number, plane number and block number of the member blocks. When a matched record is found in the bad block table BadBlks, step S308 is performed.

In step S308, the flash memory controller replaces the bad blocks with good (not damaged) blocks. The substitute block and the bad block preferably locate in the same plane which is accessed through the same way of the same channel. As shown in FIG. 2, the flash memory controller selects Blk #191 of Plane #0 accessed through Way #0 of Ch #0 to replace the bad block Blk #1 on the same plane. In this manner, the flash memory controller still accesses the super block FBlock #1 in an optimized manner (utilizing multi-channel accessing). In another exemplary embodiment, the flash memory controller selects Blk #191 of Plane #1 accessed through Way #0 of Channel #0 to replace the bad block Blk #1 of Plane #0 accessed through Way #0 of Channel #0. However, when the substitute block and the bad block do not locate in the same plane (not having the identical channel, way or plane number), the substitute block may affect the access efficiency. For example, Blk #1 and Blk #191 of Plane #1 of Way #0 of Channel #0 are not allowed to be accessed in the same time interval. The parallel accessing through multi-channel technique does not work. Blk #1 is accessed first and then Blk #191 is accessed. In another exemplary embodiment, Blk #191 is accessed early than Blk #1. Limited by the non-parallel accessing, the flash memory controller accesses the super block FBlock #1 in a reduced efficiency.

In step S310, the flash memory controller uses a difference mark table DiffOffset to mark that the super block contains at least one substitute member block. In addition to the difference mark table DiffOffsete, a bitmap table Diff-BlkBitMap and a substitute block table BlkAddr are also provided in the disclosure. The remapping table 200 is replaced by the three tables DiffOffset, DiffBlkBitMap and BlkAddr. The bitmap table DiffBlkBitMap and a substitute block table BlkAddr may be combined as a big table DiffAddr to simplify the management of the tables.

The size of the difference mark table DiffOffset is preferably proportional to the total number of super blocks FBlocks. In an exemplary embodiment, the size of the difference mark table DiffOffset is 128 bits, and each bit corresponds to a super block FBlock. "1" indicates that the corresponding super block FBlock has at least one default member block being damaged. "0" indicates that the corresponding super block FBlock has no default member block being damaged.

In another exemplary embodiment, the size of the difference mark table DiffOffset is 128 bytes. Each byte corresponds to one super block FBlock to mark whether the super block FBlock has any default member block being damaged. Referring to the example of FIG. 4A, the super blocks FBlock #0, #2~#127 are marked by OXFFFF in the difference mark table DiffOffset. It means that the super blocks FBlock #0, #2~#127 have no default member block being damaged. The super block FBlock #1 is marked by another value rather than OXFFFF. It means that the super block FBlock #1 has at least one default member block being damaged. As shown, the super block FBlock #1 is marked by OX0000, which is an address for searching the big table DiffAddr. Each address may correspond to information of a preset length (e.g. one word of information).

Figure 4A:
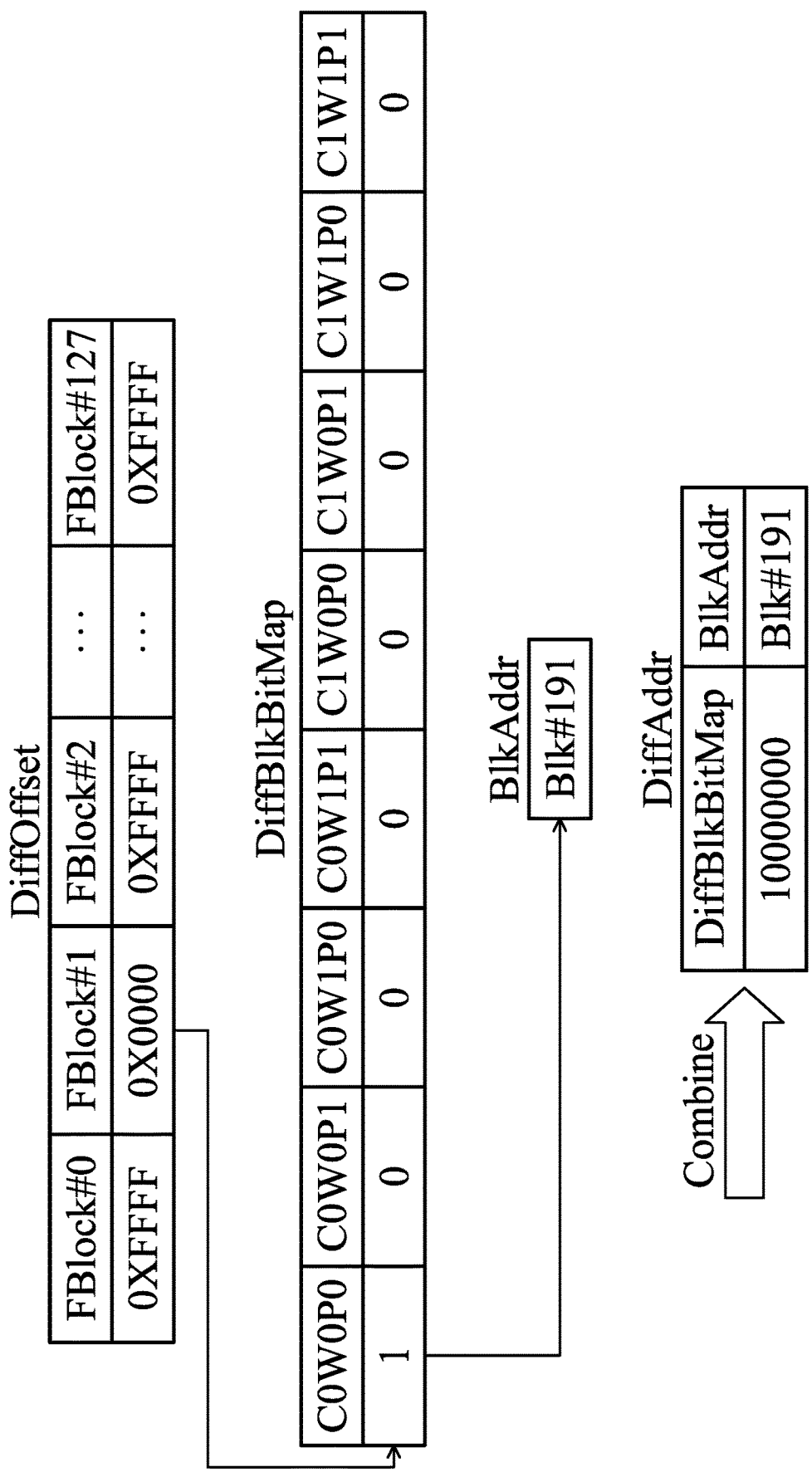
FIGS. 4A, 4B and 4C show examples of the difference mark table DiffOffsete, a bitmap table DiffBlkBitMap and a substitute block table BlkAddr, wherein the bitmap table DiffBlkBitMap and substitute block table BlkAddr form a big table DiffAddr.

In step S312, the flash memory controller writes the bitmap table DiffBlkBitMap for substitution indication. As shown in FIG. 4A, corresponding to the bad block Blk #1 of Plane #0 accessed through Way #0 of Channel #0, the flash memory controller asserts the bit corresponding to (C0W0P0). The other bits are set to 0. The bitmap table DiffBlkBitMap records '10000000' for FBlock #1.

In step S314, the flash memory controller manages the substitute block table BlkAddr for substitute block indication. There are a variety of ways for the flash memory controller to select a good block as the substitute. In an exemplary embodiment, Blk #191 is not recorded in the bad block table BaddBks and, therefore, is selected as the substitute block. The block number of Blk #191 is written to the substitute block table BlkAddr as shown in FIG. 4A. The big table DiffAddr is twice the preset length.

Figure 4B:
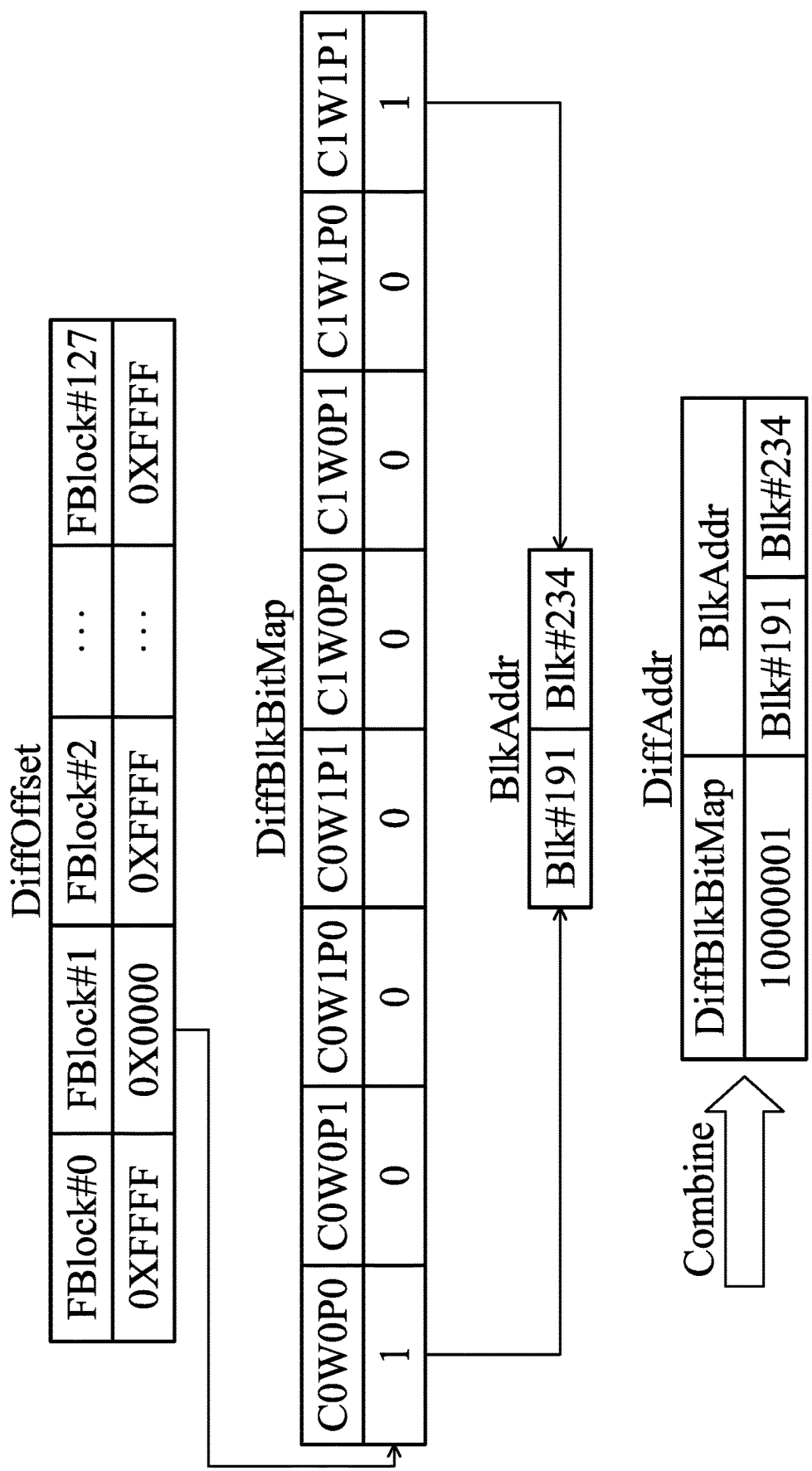

In another exemplary embodiment, when forming the super block FBlock #1, it is determined that not only the block Blk #1 of Plane #0 accessed through Way #0 of Channel #0 is damaged, but also the block Blk #1 of Plane #1 accessed through Way #1 of Channel #1 is a bad block. The flash memory controller performs step S312 to indicate the damaged blocks in the bitmap table DiffBlkBitMap. As shown, the bitmap table DiffBlkBitMap of FIG. 4B records "10000001" rather than "10000000" presented in FIG. 4A. In step S314, the flash memory controller selects block Blk #191 of C0W0P0 and Blk #234 of C1W1P1 to replace the two bad blocks, and records the block Blk #191 and the block Blk #234 in the substitute block table BlkAddr. As shown in FIG. 4B, the big table DiffAddr is triple the preset length.

Figure 4C:
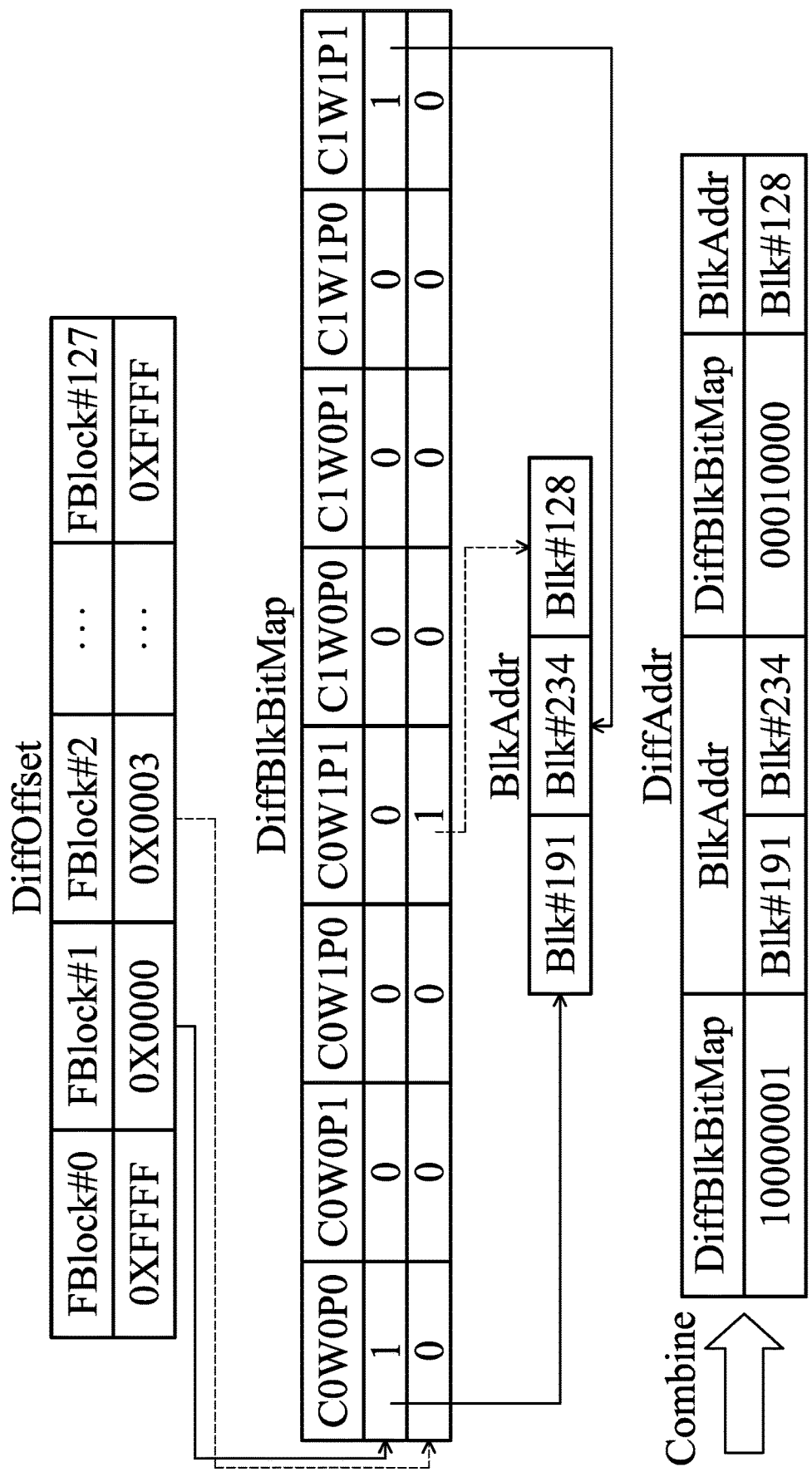

Proceeding to the example of FIG. 4C, the method for establishing a super block FBlock is executed again. This time, the flash memory controller determines in step S306 that super block FBlock #2 corresponds to a bad block Blk #2 of Plane #1 accessed through Way #1 of Channel #0. In step S308, the flash memory controller selects Blk #128 of the same plane as the substitute block. In step S310, the flash memory controller sets the value corresponding to the super block FBlock #2 in the difference mark table DiffOffset to be 0x0003, which indicates that the information of block substitution starts from the 4th entry of the big table DiffAddr. In step S312, the flash memory controller writes the bitmap table DiffBlkBitMap to indicate the position of the bad block. As shown, bitmap "00010000" is written to the bitmap table DiffBlkBitMap. In step S314, the flash memory controller records the block number of Blk #128 in the substitute block table BlkAddr as shown in FIG. 4C.

Figure 5:
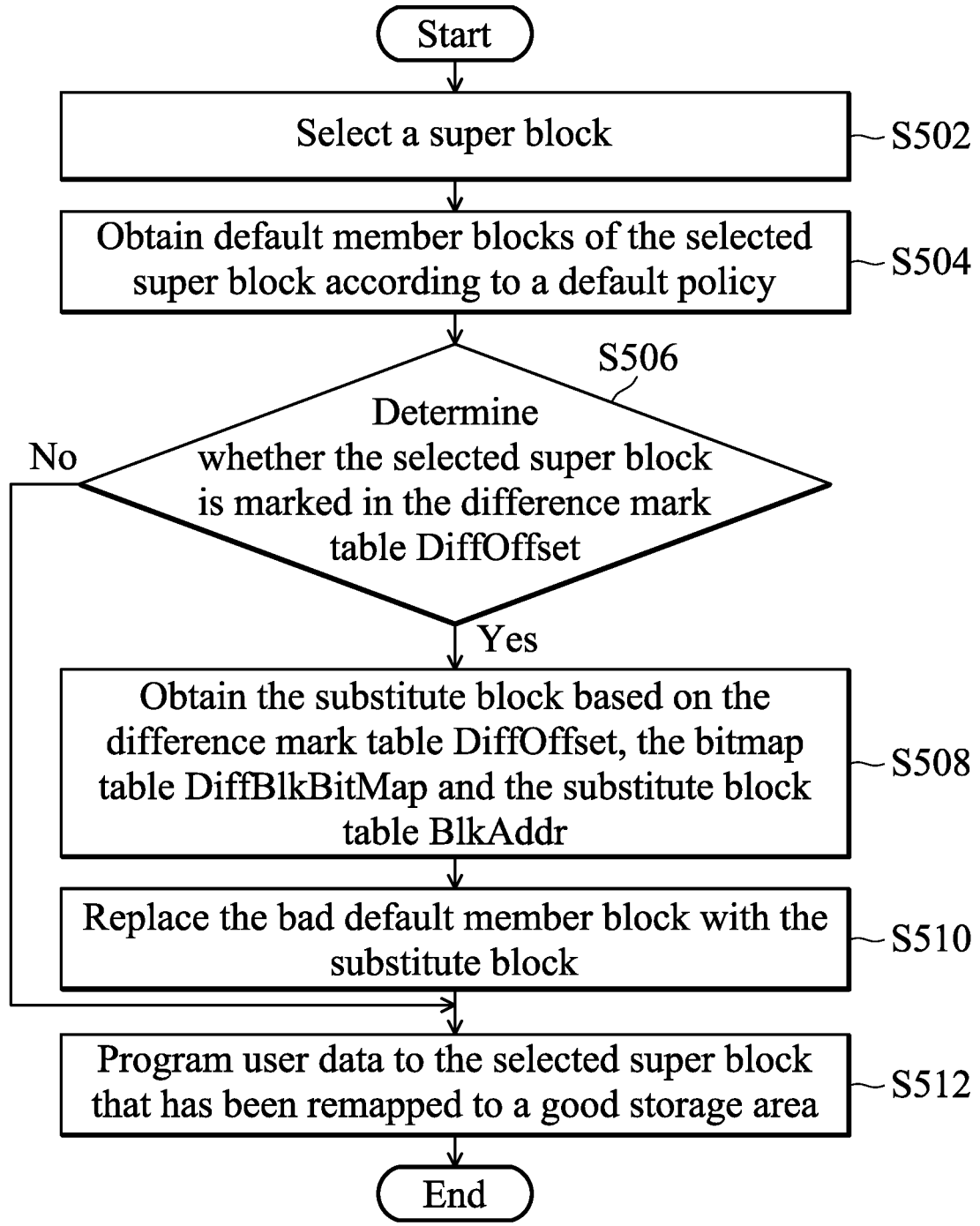
FIG. 5 is a flowchart depicting how the flash memory controller programs user data to a super block FBlock in response to an external command (e.g., a write command from a host) or an internal command (e.g., a command for garbage collection or wear leveling)

The method for establishing a super block FBlock is repeated until allocation of all super blocks FBlocks (e.g., including super blocks FBlock #0~#127) is finished. The difference mark table DiffOffset, the bitmap table DiffBlk-BitMap and the substitute block table BlkAddr, therefore, are established. In an exemplary embodiment, the bitmap table DiffBlkBitMap and the substitute block table BlkAddr are combined as a big table DiffAddr. The flash memory controller programs the flash memory based on the allocated super blocks FBlocks. FIG. 5 is a flowchart depicting how the flash memory controller programs user data to a super block FBlock in response to an external command (e.g., a write command from a host) or an internal command (e.g., a command for garbage collection or wear leveling).

In step S502, the flash memory controller selects a super block. For example, the flash memory controller may select the super block FBlock #1 when programming of user data on the super block FBlock #0 has completed.

In step S504, the flash memory controller obtains default member blocks of the selected super block according to a default policy. The flash memory controller may regard the blocks with the same block number in the different planes as the related member blocks. For example, blocks Blk #1 in all planes may be regarded as default member blocks of the super block FBlock #1.

In step S506, the flash memory controller determines whether the selected super block is marked in the difference mark table DiffOffset. In this exemplary embodiment, the super block FBlock #1 was marked in the difference mark table DiffOffset by the aforementioned step S310. The flash memory controller identifies the mark of the super block FBlock #1 and, accordingly, performs step S508.

In step S508, the flash memory controller obtains the substitute block based on the difference mark table DiffOffset, the bitmap table DiffBlkBitMap and the substitute block table BlkAddr. The example of FIG. 4A is discussed here. According to the address "0x0000" recorded as a mark in the difference mark table DiffOffset for the super block FBlock #1, the flash memory controller reads the first entry of the big table DiffAddr to get the bitmap "10000000" that is recorded as the bitmap table DiffBlkBitMap. The bitmap "10000000" shows that the super block FBlock #1 has a bad default member block in Plane #0 accessed through Way #0 of Channel #0. Following the bitmap "10000000" is the information regarding the substitute block. As shown, according to the information read from the substitute block table BlkAddr following the bitmap "10000000", the flash memory controller obtains that the substitute block is Blk #191.

In step S510, the flash memory controller replaces the bad default member block with the substitute block. The flash memory controller replaces the bad block Blk #1 with the substitute block Blk #191 in the same plane. According to the substitution, the super block FBlock #1 is formed by the substitute block Blk #191 and blocks Blk #1 in the other planes.

In step S512, the flash memory controller programs user data to the selected super block that has been remapped to a good storage area. The flash memory controller can successfully write user data to the super block FBlock #1 since the bad block has been replaced by a good block. The flash memory controller may repeat the programming procedure to program user data to the other super blocks FBlocks.

In the example of FIG. 4B, the flash memory controller learns from the bitmap "10000001" recorded in the bitmap table DiffBlkBitMap that the super block FBlock #1 has two bad default member blocks. The flash memory controller reads two pieces of information from the substitute block table BlkAddr. The first piece of information indicates the first substitute block Blk #191, and the second piece of information indicates the second substitute block Blk #234. The flash memory controller can successfully write user data to the super block FBlock #1 since the two bad blocks have been replaced by two good blocks.

In this paragraph, an architecture using two channels with each channel having two ways and each way involving accessing to two planes is discussed. 16 bytes is required to form mapping information in the remapping architecture 200 for the super block FBlock. When the super block FBlock has only one bad block, only 4 bytes are required to form mapping information in the difference mark table DiffOffset, the bitmap table DiffBlkBitMap and the substitute block table BlkAddr for the super block FBlock. When the super block FBlock corresponds to two bad default member blocks, only 6 bytes are required to form mapping information in the difference mark table DiffOffset, the bitmap table DiffBlkBitMap and the substitute block table BlkAddr for the super block FBlock. In comparison with the 16 bytes required in the remapping architecture 200, the table architecture formed by the difference mark table DiffOffset, the bitmap table DiffBlkBitMap and the substitute block table BlkAddr is in a size much smaller than a remapping table in the architecture 200. The method for allocation of super blocks FBlocks and the method for programming the super blocks FBlock in the disclosure lead to significant progress.

Figure 6:
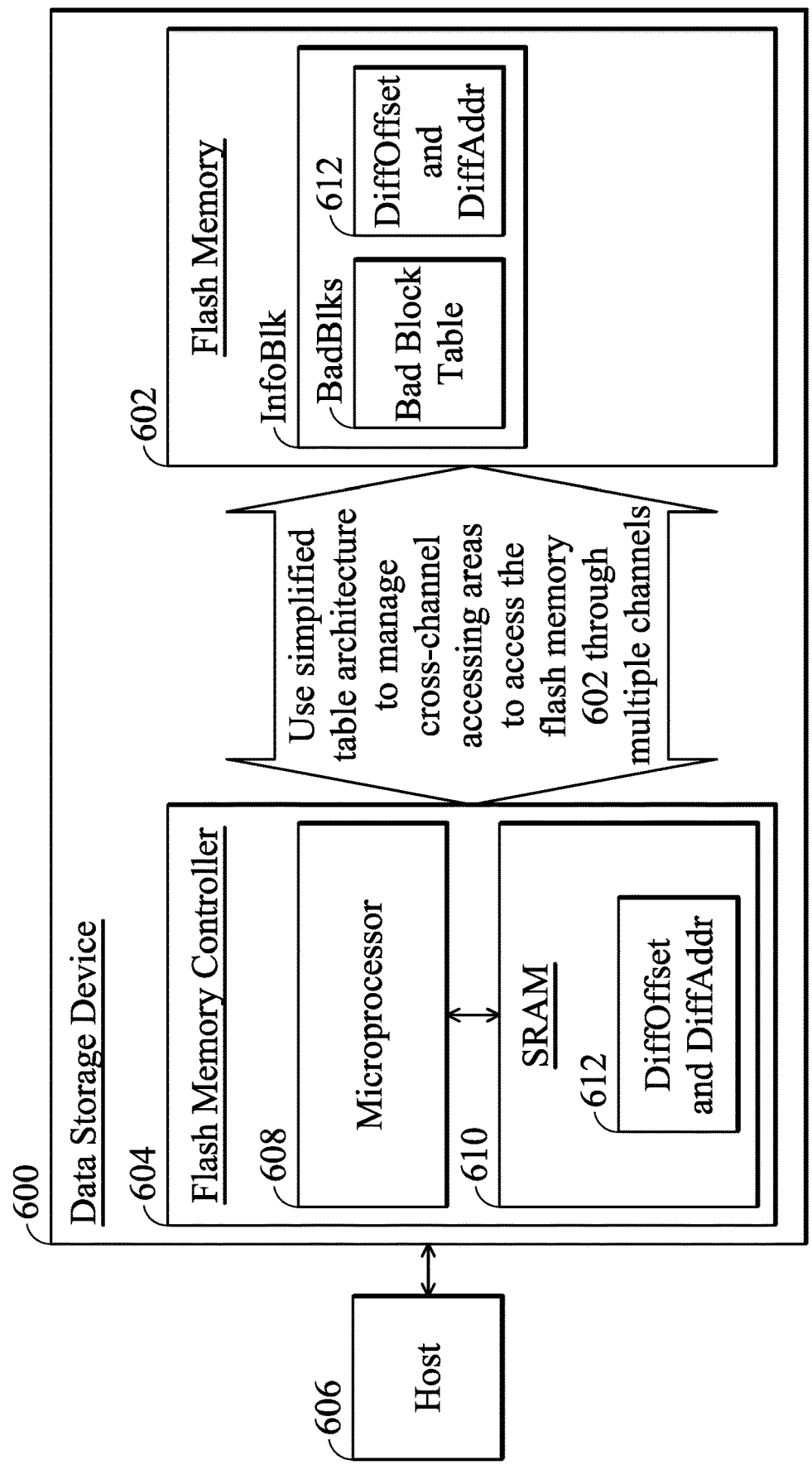
FIG. 6 is a block diagram illustrating a data storage device 600 in accordance with an exemplary embodiment of the disclosure, which includes a flash memory 602 and a flash memory controller 604.

FIG. 6 is a block diagram illustrating a data storage device 600 in accordance with an exemplary embodiment of the disclosure, which includes a flash memory 602 and a flash memory controller 604. A host 606 operates the flash memory 602 through the flash memory controller 604. The flash memory controller 604 may include a microprocessor 608 and a static random access memory (SRAM) 610. The flash memory 602 may be allocated to provide a system information block InfoBlk storing a bad block table BadBlks and the tables DiffOffset and DiffAddr (with reference numeral 612) of the disclosure. The bad block table BadBlks may be established by a factory machine execution tool during the manufacturing (or mass-production) process. The tables 612 (including DiffOffset and DiffAddr) for management of cross-channel accessing areas may be established by the microprocessor 608 based on the bad block table BadBlks during a card-opening process. After the card-opening process, the flash memory controller 604 enters an operational mode to operate the flash memory 602 in accordance with requests from the host 606. As the data storage device 600 is powered on, the microprocessor 608 downloads the tables 612 (including tables DiffOffset and DiffAddr) from the system information block InfoBlk of the flash memory 602 to the static random access memory 610. According to the downloaded information, the microprocessor 608 obtains allocation of cross-channel accessing areas and thereby accesses the flash memory 602 through multiple channels. The cross-channel accessing areas for accessing the flash memory 602 through multiple channels is successfully managed by the simplified table architecture proposed in the disclosure. Because the data storage device 600 benefits from the simple tables 612, a dynamic random access memory (DRAM) is unnecessary, and the cost is reduced.

Any techniques using the proposed tables 612 to manage the cross-channel accessing areas of a non-volatile memory may be within the scope of the present invention. The present invention further discloses a method for operating a non-volatile memory according to the foregoing concepts, including the establishment and the utilization of the tables 612.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A data storage device, comprising:
a non-volatile memory; and
a controller, accessing the non-volatile memory through multiple channels,
wherein:
the controller uses a first table, a second table and a third table to manage cross-channel accessing areas on the non-volatile memory and accesses the non-volatile memory through multiple channels based on the first table, the second table and the third table;
each cross-channel accessing area involves M storage units, where M is a plural number;

for each cross-channel accessing area, the first table marks whether there is a need for storage unit substitution and points to substitution information;

the substitution information is stored in the second table and the third table; and for each cross-channel accessing area marked in the first table, the second table stores M bits corresponding to M storage units of the marked cross-channel accessing area for substitution indication, and related substitute storage unit indication is stored in the third table.

2. The data storage device as claimed in claim 1, wherein:
the third table is maintained without storing information for storage units which have no need for substitution.

3. The data storage device as claimed in claim 1, wherein:
each entry of the third table is a preset length;
each entry of the second table stores the M bits in the preset length and is followed by the related substitute storage unit indication which is used to form the third table; and
the first table points to the second table by an offset number calculated according to the preset length.

4. The data storage device as claimed in claim 1, wherein:
during a card-opening process, the controller establishes the first table, the second table and the third table based on a damaged storage unit table recorded in the non-volatile memory, and avoids allocating damaged storage units to form the cross-channel accessing areas.

5. The data storage device as claimed in claim 4, wherein:
the damaged storage unit table is established during a manufacturing process; and
a manufacturing machine scans the non-volatile memory to establish the damaged storage unit table.

6. The data storage device as claimed in claim 1, further comprising a volatile memory, wherein:
the controller downloads the first table, the second table and the third table from the non-volatile memory to the volatile memory to access the non-volatile memory through multiple channels based on the first table, the second table and the third table downloaded to the volatile memory.

7. The data storage device as claimed in claim 1, wherein:
the non-volatile memory is a flash memory and includes a plurality of blocks each including a plurality of pages, and the storage units are the blocks; and
M blocks form a super block which is allocated as one cross-channel accessing area.

8. The data storage device as claimed in claim 7, wherein:
the controller writes data to a super block on a super page basis; and
each super page is formed by M pages provided by M blocks of the corresponding super block.

9. The data storage device as claimed in claim 7, wherein:
M blocks of one super block are provided by M planes.

10. The data storage device as claimed in claim 9, wherein:
M is a product of the total number of channels, the total number of ways of each channel, and the total number of planes of each way.

11. A control method for non-volatile memory, comprising:
establishing a first table, a second table and a third table to manage cross-channel accessing areas on a non-volatile memory; and
accessing the non-volatile memory through multiple channels based on the first table, the second table and the third table,
wherein:

each cross-channel accessing area involves M storage units, where M is a plural number;

for each cross-channel accessing area, the first table marks whether there is a need for storage unit substitution and points to substitution information;

the substitution information is stored in the second table and the third table; and for each cross-channel accessing area marked in the first table, the second table stores M bits corresponding to M storage units of the marked cross-channel accessing area for substitution indication, and related substitute storage unit indication is stored in the third table.

12. The control method as claimed in claim 11, wherein:
the third table is maintained without storing information for storage units which have no need for substitution.

13. The control method as claimed in claim 11, wherein:
each entry of the third table is a preset length;
each entry of the second table stores the M bits in the preset length and is followed by the related substitute storage unit indication which is used to form the third table; and
the first table points to the second table by an offset number calculated according to the preset length.

14. The control method as claimed in claim 11, further comprising:
during a card-opening process, establishing the first table, the second table and the third table based on a damaged storage unit table recorded in the non-volatile memory; and
skipping damaged storage units when forming the cross-channel accessing areas.

15. The control method as claimed in claim 14, wherein:
the damaged storage unit table is established during a manufacturing process; and
a manufacturing machine scans the non-volatile memory to establish the damaged storage unit table.

16. The control method as claimed in claim 11, further comprising:
providing a volatile memory; and
downloading the first table, the second table and the third table from the non-volatile memory to the volatile memory to access the non-volatile memory through multiple channels based on the first table, the second table and the third table downloaded to the volatile memory.

17. The control method as claimed in claim 11, wherein:
the non-volatile memory is a flash memory and includes a plurality of blocks each including a plurality of pages, and the storage units are the blocks; and
M blocks form a super block which is allocated as one cross-channel accessing area.

18. The control method as claimed in claim 17, further comprising:
writing data to a super block on a super page basis,
wherein each super page is formed by M pages provided by M blocks of the corresponding super block.

19. The control method as claimed in claim 17, wherein:
M blocks of one super block are provided by M planes.

20. The control method as claimed in claim 19, wherein:
M is a product of the total number of channels, the total number of ways of each channel, and the total number of planes of each way.

* * * * *